(12) United States Patent
Chang

(10) Patent No.: US 9,129,809 B2
(45) Date of Patent: Sep. 8, 2015

(54) SILICON CONTROLLED RECTIFIER FOR HIGH VOLTAGE APPLICATIONS

(71) Applicant: Taiwan Semiconductor Manufacturing Co., Ltd., Hsin-Chu (TW)

(72) Inventor: Yi-Feng Chang, Xinbei (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 13/958,901

(22) Filed: Aug. 5, 2013

(65) Prior Publication Data

US 2015/0035007 A1    Feb. 5, 2015

(51) Int. Cl.
| | |
|---|---|
| *H01L 23/552* | (2006.01) |
| *H01L 27/088* | (2006.01) |
| *H01L 29/74* | (2006.01) |
| *H01L 31/111* | (2006.01) |
| *H01L 23/62* | (2006.01) |
| *H01L 27/02* | (2006.01) |

(52) U.S. Cl.
CPC ........ *H01L 27/0262* (2013.01); *H01L 29/7436* (2013.01)

(58) Field of Classification Search
CPC ........ H01L 29/74; H01L 31/111; H01L 23/62
USPC ........ 257/107, 355, 110, 343, 362, 122, 162, 257/165, 172
See application file for complete search history.

(56) References Cited

U.S. PATENT DOCUMENTS

| | | | |
|---|---|---|---|
| 6,717,219 B1* | 4/2004 | Vashchenko et al. | 257/355 |
| 7,414,273 B2* | 8/2008 | Mohn et al. | 257/122 |
| 7,875,902 B2* | 1/2011 | Kodama et al. | 257/107 |
| 2014/0197450 A1* | 7/2014 | He et al. | 257/133 |

* cited by examiner

*Primary Examiner* — Kimberly Rizkallah
*Assistant Examiner* — Brian Turner
(74) *Attorney, Agent, or Firm* — Eschweiler & Associates, LLC

(57) ABSTRACT

In a silicon-controlled rectifier, an anode region includes p-type anode well regions which are laterally surrounded by an n-type well region. A length of a p-type anode well region, as measured in a first direction, is greater than a width of the p-type anode well region, as measured in a second direction perpendicular to the first direction. A p-type well region meets the n-type well region at a junction, wherein the junction extends between the p-type well region and n-type well region in the second direction. A cathode region includes a plurality of n-type cathode well regions which are formed in the p-type well region. A length of an n-type cathode well region, as measured in the first direction, is greater than a width of the n-type cathode well region, as measured in the second direction.

22 Claims, 5 Drawing Sheets

100

100

SILICON CONTROLLED RECTIFIER FOR HIGH VOLTAGE APPLICATIONS

BACKGROUND

FIG. 1A shows a schematic symbol of an SCR device 100, which acts like a diode with a control gate. As shown in FIG. 1B, SCR 100 has four layers of alternating N-type and P-type material, which are implemented as a pair of tightly coupled bipolar junction transistors (BJTs) 102A, 102B. In such an SCR device 100, when a gate current or gate-to-cathode voltage exceeds a certain threshold (e.g., when an electrostatic discharge (ESD) event occurs), SCR 100 turns "on". SCR 114 will remain "on" even after gate current is removed so long as current/voltage through SCR 100 remains above a holding current/voltage. Once current/voltage falls below the holding current/voltage for an appropriate period of time (e.g., once an ESD event has passed), SCR 100 will switch "off" and normal blocking operation will resume.

DETAILED DESCRIPTION

Figure 1A:
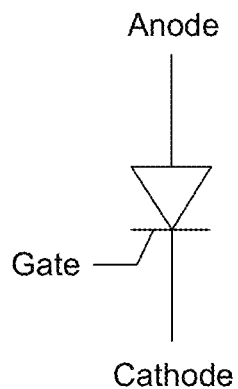
FIG. 1A shows a symbolic representation of a conventional silicon controlled rectifier (SCR).
Figure 1B:
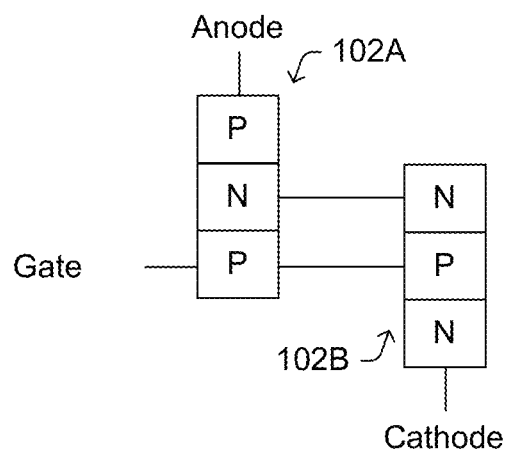
FIG. 1B shows a depiction of a conventional SCR.

One or more implementations of the present invention will now be described with reference to the attached drawings, wherein like reference numerals are used to refer to like elements throughout. The drawings are not drawn to scale.

To reduce the area consumed by SCR devices while maintaining good SCR holding voltages, the present disclosure provides SCR devices that have a number of anode well regions, which are formed in a first well, and a number of cathode well regions, which are formed in a second well. The first and second wells meet at a junction extending in a first direction. The anode and cathode well regions are arranged to extend in a second direction which is perpendicular to the first direction. As will be appreciated in greater detail herein, these anode and cathode well regions promote good high voltage behavior in a reduced area, relative to conventional solutions. Additional wells can also be present to promote even better tradeoffs with performance and area.

Figure 2A:
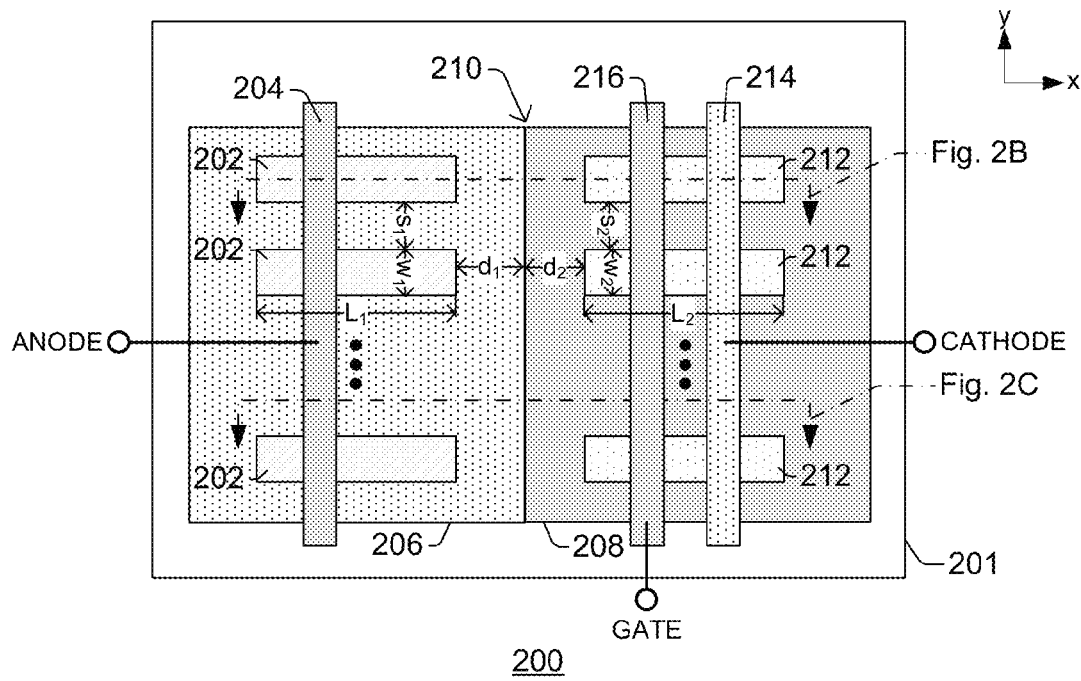
FIG. 2A shows a top view of some embodiments of an SCR.
Figure 2B:
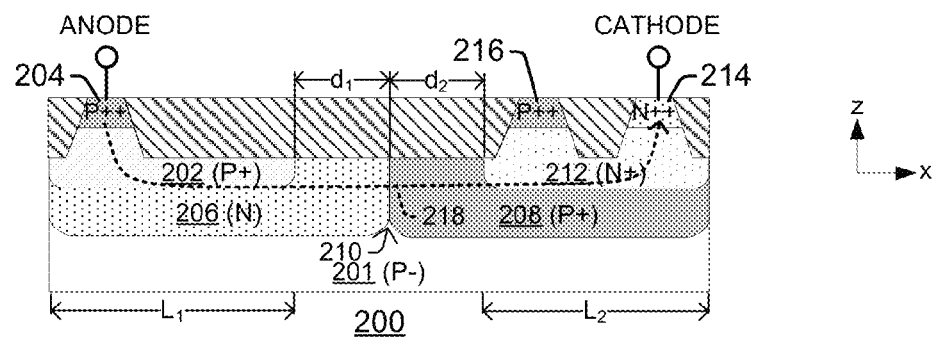
FIGS. 2B-2C show cross-sectional views of FIG. 2A's SCR taken along the cut-away lines as indicated in FIG. 2A.
Figure 2C:
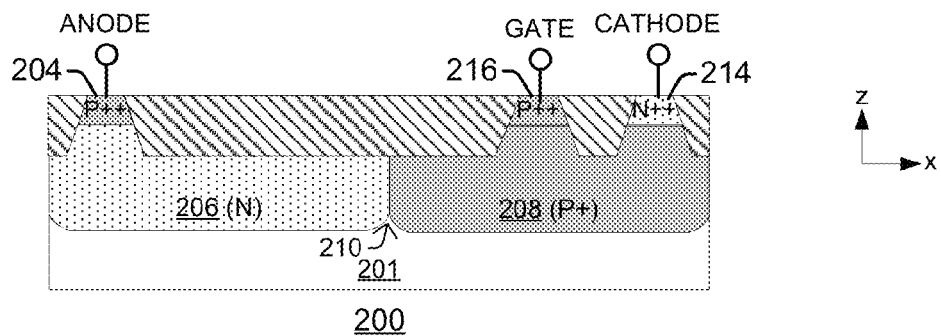

FIG. 2A shows a top-view of a silicon controlled rectifier (SCR) device 200 formed on a substrate 201 (e.g., p-type substrate) in accordance with various embodiments of the present disclosure. FIGS. 2B-2C show cross-sectional views of the SCR device 200 along the cut-lines depicted in FIG. 2A in accordance with various embodiments of the present disclosure. The SCR 200 includes an anode region (ANODE) comprising an integer number ($N_1$) of p-type anode well regions 202, which are operably coupled to an anode contact 204 (e.g., P+ region). Each p-type anode well region 202 has a length, $L_1$, in a first direction (e.g., x-direction) and a width, $w_1$, in a second direction (e.g., y-direction). The length $L_1$ is greater than the width $w_1$. The anode contact 204 runs perpendicular to the p-type anode well regions 202. An n-type well region 206 laterally surrounds the p-type anode well regions 202. A p-type well region 208 meets the n-type well region 206 at a first junction 210, which extends in the second direction between the n-type and p-type well regions 206, 208. A cathode region (CATHODE) includes an integer number ($N_2$) of n-type cathode well regions 212. An n-type cathode well region 212 has a length, $L_2$, in the first direction and a width, $w_2$, in the second direction. The length $L_2$ is greater than the width $w_2$. A cathode contact 214 (e.g., N+ region) operably couples the n-type cathode well regions 212 to one another, and a gate contact 216 (e.g., P+ region) is coupled to the p-type well region 208. Notably, the arrangement of p-type anode well regions 202 and n-type cathode well regions 212 provide for good current flow between the anode and cathode in a compact area.

During operation and as shown by arrow 218 in FIG. 2B, electrical current selectively flows from the anode to the cathode, depending on the bias condition applied to the anode, cathode, and gate terminals. When the SCR 200 is reverse biased, it will block current flow (at least until a failure mode, such as avalanche breakdown for example, occurs). When the SCR 200 is forward biased, it will allow current flow (i.e., turn "on") so long as the gate current and/or gate voltage is higher than a predetermined threshold. Once "on", SCR 200 will remain "on" even after gate current or gate voltage is removed so long as current/voltage through SCR 200 remains above a holding current/voltage. Once current/voltage falls below the holding current/voltage for an appropriate period of time (e.g., once an ESD event has passed), SCR 200 will switch "off" and normal blocking operation will resume.

Although FIG. 2A shows an example where the number of p-type anode well regions 202 ($N_1$) is equal to the number of n-type cathode well regions 212 ($N_2$), in other embodiments $N_1$ can be different from $N_2$. Further, although all the p-type anode well regions 202 are illustrated as having equal lengths $L_1$ and equal widths $W_1$ in FIG. 2A, it will be appreciated that the p-type anode well regions 202 can have different lengths and/or different widths from one another. Also, the p-type anode well regions 202 need not be spaced apart in the second direction by equal distances $s_1$ as illustrated, but can be spaced apart by different distances. Spacing the p-type anode well regions 202 apart by the same equal distances $s_1$ can be advantageous, however, in minimizing the area of the device, particularly when this distance $s_1$ is the minimum feature size on the IC.

Similarly, although all the n-type cathode well regions 212 are illustrated as having equal lengths $L_2$ and equal widths $w_2$ in FIG. 2A, it will be appreciated that the n-type cathode well regions 212 can have different lengths and/or different widths from one another. Also, the n-type cathode well regions 212 need not be spaced apart by equal distances $s_2$ as illustrated, but can be spaced apart by different distances. Spacing the n-type cathode well regions 212 apart by the same equal distances can be advantageous, however, in minimizing the area of the device, particularly when this distance is the minimum feature size on the IC. This spacing $s_2$ can be the same as spacing $s_1$, but can also be different.

Still further, in some embodiments the p-type anode well regions 202 have an inner edge that is spaced apart in the first direction from the first junction 210 by a distance $d_1$. The n-type cathode well regions 212 can similarly have an inner edge that is spaced apart from the first junction 210 in the first direction by a distance $d_2$. These distances $d_1$, $d_2$ can help set a breakdown voltage for the SCR device 200. For example if $d_1$ and $d_2$ are made larger, the breakdown voltage will increase; and if $d_1$ and $d_2$ are made smaller, the breakdown voltage will decrease. Distances $d_1$ and $d_2$ can be equal (as shown), but can also be different, depending on the implementation.

In some embodiments, a ratio $s_1/w_1$ (and/or $s_2/w_2$) can also be tuned by a designer to set the SCR characteristics. For example, in some embodiments, when $s_1/w_1$ and $s_2/w_2$ are each set to a ratio of 2/1, the breakdown voltage (VBD) of the SCR can be approximately 56 volts, the trigger voltage (Vt1) can be approximately 60 volts, the holding voltage can be approximately 33 volts, and the failure current (It2) can be approximately 8.2 amps. In contrast, if $s_1/w_1$ and $s_2/w_2$ are each set to a ratio of 1/1, VBD of the SCR can remain at approximately 56 volts, Vt1 can be increased to approximately 77 volts, the holding voltage can be increased to approximately 43 volts, and It2 can be reduced to approximately 8 amps. Further, if $s_1/w_1$ and $s_2/w_2$ are each set to a ratio of ½, VBD of the SCR can remain at approximately 56 volts, Vt1 can be increased to approximately 85 volts, the holding voltage can be increased to approximately 47 volts, and It2 can be reduced to approximately 7.5 amps. Other ratios are also possible, and these are merely illustrative examples. Also, depending on the materials used, dopant concentrations involved, geometries of the features, and other factors, the values of the voltages and currents described above can vary from what is listed.

Figure 3A:
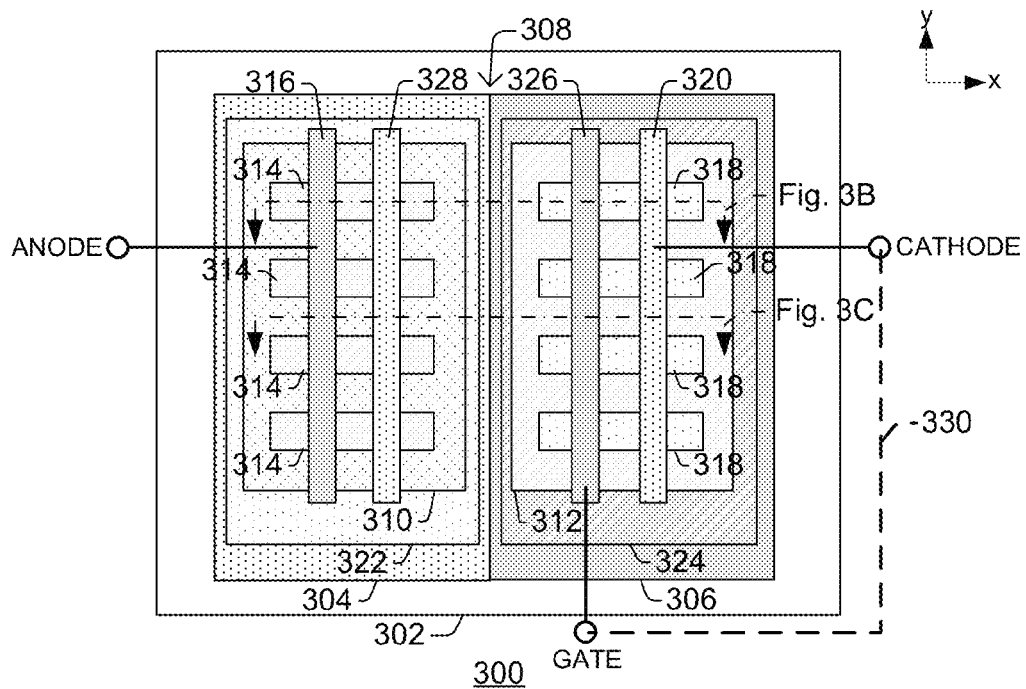
FIG. 3A shows a top view of some embodiments of an SCR.
Figure 3B:
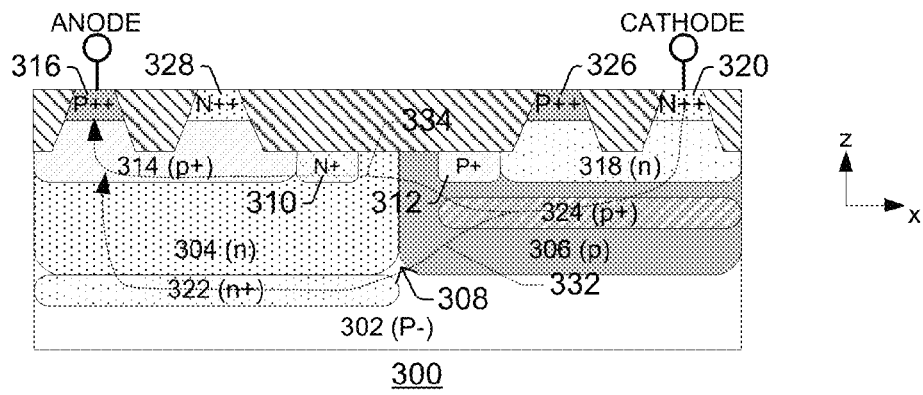
FIGS. 3B-3C show cross-sectional views of FIG. 3A's SCR taken along the cut-away lines as indicated in FIG. 3A.
Figure 3C:
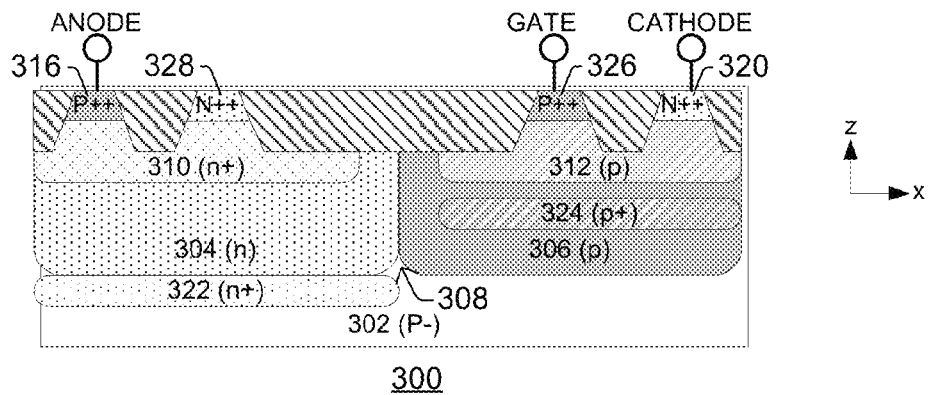

To provide an even more robust design, additional features can be added, for example as shown in the SCR device 300 illustrated in FIGS. 3A-3C. FIG. 3A shows some embodiments of a top-view of an SCR device 300, and FIGS. 3B-3C show cross-sectional views of the SCR device 300 along the cut-lines depicted in FIG. 3A.

The SCR device 300 is disposed on a semiconductor substrate 302 (e.g., p-substrate) and includes a first high voltage well region 304 having a first conductivity type (e.g., n-type), and a second high voltage well region 306 having a second conductivity type (e.g., p-type). The first and second high voltage well regions 304, 306 meet at a first junction 308. The first junction 308 extends between the first and second high voltage well regions 304, 306 in a first direction (e.g., y-direction).

A first shallow well region 310, which has the first conductivity type, is formed in the first high-voltage well region 304. A second shallow well region 312, which has the second conductivity type, is formed in the second high voltage well region 306.

A number of anode well regions 314 which have the second conductivity type are formed in the first high-voltage well region 304. An anode contact region 316 is formed over and coupled to the anode well region 314, the anode contact region 316 having the second conductivity type (e.g., p+).

A number of cathode well regions 318 have the first conductivity type and are formed in the second high-voltage well region 306. A cathode region 320 is formed over and coupled to the cathode well regions 318, the cathode region having the first conductivity type (e.g., n+).

A buried region 322 having the first conductivity type (e.g., n-type) is formed beneath the high-voltage n-well 322, and typically has a higher dopant concentration than the high-voltage n-well 322. A deep well 324 having the second conductivity type (e.g., p-type) is formed in the high voltage p-well 306 and is spaced vertically apart from cathode well regions 318.

A gate contact (e.g., p+ region) 326 is formed in parallel with the cathode contact 320. The gate contact 326 is operably coupled to the second shallow well region 312. In some embodiments, the gate contact 326 can be electrically coupled to the cathode contact 320 (see line 330). A contact 328, which has the first conductivity type (e.g., n+) is formed in parallel to the anode contact 316 and is operably coupled to the first shallow well region 310.

During operation of SCR 300, electrical current selectively flows from the anode to the cathode, depending on the bias condition applied to the anode, cathode, and gate terminals. The total current includes a relatively shallow electron current (see arrow 332) and a relatively deep electron current (see arrow 334) (where electron current is opposite in direction to total current), as well as a relatively shallow hole current that mirrors the relatively shallow electron current (not shown). Thus, the n-buried layer 322 promotes the relative deep electron current and thereby helps promote a denser layer for the device.

Compared to conventional SCRs, the arrangement depicted in FIG. 3A-3C can reduce the area by more than 60%, while maintaining equal or better performance characteristics in many regards.

Figure 4:
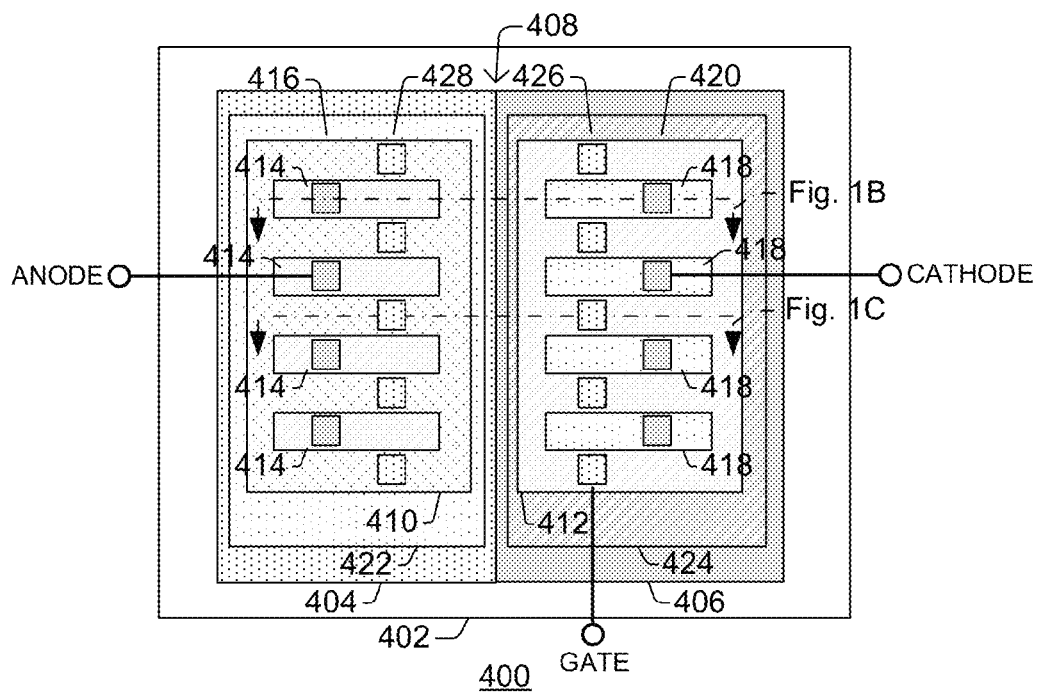
FIG. 4 shows an embodiment where the anode contact region is made up of discrete rather than continuous regions, and the cathode contact region is also made up of discrete rather than continuous regions.

FIG. 4 depicts another embodiment where rather than the anode contact and cathode contact being continuous contacts as shown in FIGS. 2-3, the anode contact and cathode contact are a series of discrete conductive regions. A metal layer or other conductive layer can couple these discrete conductive regions to one another for the anode and/or cathode.

Figure 5:
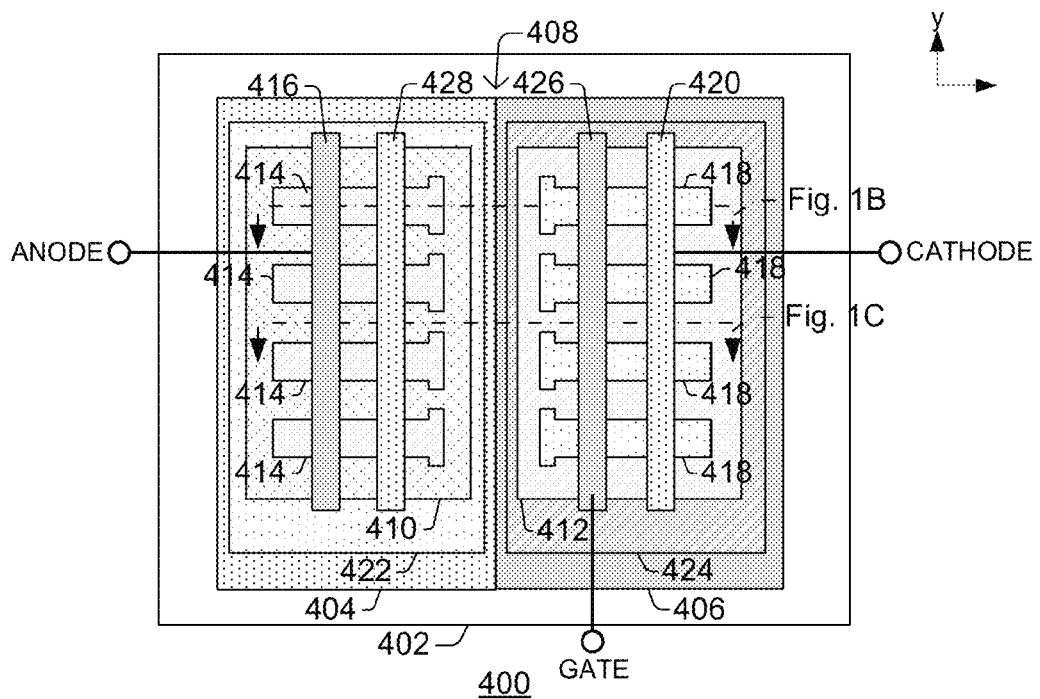
FIG. 5 shows an embodiment where anode p-type well regions and anode n-type regions are T-shaped.

In FIG. 5, to promote still greater area reduction, the anode p-type well regions and anode n-type regions are T-shaped, rather than being simple linear structures as shown in the earlier embodiments of FIGS. 2-4.

Figure 6:
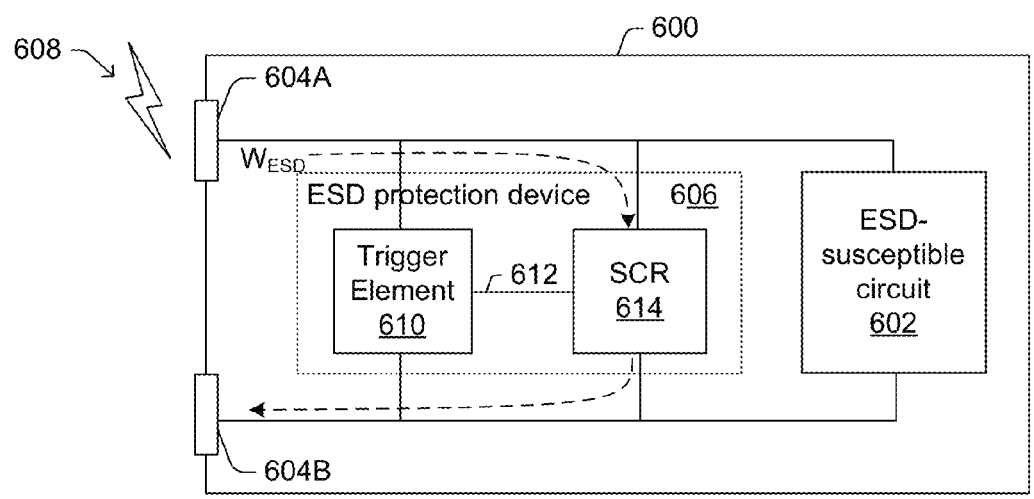
FIG. 6 shows an example of an integrated circuit that includes an electrostatic discharge (ESD) protection circuit that includes an SCR device as disclosed herein.

FIG. 6 shows an example of how some embodiments of an SCR can be included on an integrated circuit (IC) 600 as part of an ESD protection scheme. The IC 600 includes an ESD-susceptible circuit 602 that can be electrically connected to an exterior circuit assembly (not shown) via external IC pins 604A, 604B. ESD protection device 606 is electrically connected between circuit 602 and external pins 604A, 604B to mitigate damage due to an ESD pulse 608, if present. If an ESD pulse 608 occurs, a trigger element 610 detects ESD pulse 608 and provides a trigger signal 612 to a silicon controlled rectifier (SCR) 614. In response to this trigger signal 612, SCR 614 quickly shunts energy of ESD pulse 608 away from circuit 602 (e.g., as shown by arrow $W_{ESD}$), thereby preventing damage to circuit 602. After initially turning on, the SCR 614 will remain "on" even after gate current is removed so long as current/voltage through SCR 600 remains above a holding current/voltage. Once current/voltage falls below the holding current/voltage for an appropriate period of time (e.g., once an ESD event has passed), SCR 600 will switch "off" and normal blocking operation will resume, such that the pins 604A, 604B are again electrically isolated from one another.

Thus, it will be appreciated that some embodiments relate to a silicon-controlled rectifier (SCR). In the SCR, an anode region includes p-type anode well regions which are laterally surrounded by an n-type well region. A length of a p-type anode well region, as measured in a first direction, is greater than a width of the p-type anode well region, as measured in a second direction perpendicular to the first direction. A p-type well region meets the n-type well region at a junction, wherein the junction extends between the p-type well region and n-type well region in the second direction. A cathode region includes a plurality of n-type cathode well regions which are formed in the p-type well region. A length of an n-type cathode well region, as measured in the first direction, is greater than a width of the n-type cathode well region, as measured in the second direction.

Other embodiments relate to a semiconductor device disposed on a semiconductor substrate. The device includes a first high voltage well region having a first conductivity type. A first shallow well region, which has the first conductivity type, is formed in the first high-voltage well region. A second high voltage well region having a second conductivity type, which is opposite the first conductivity type, meets the first high voltage well region at a first junction, wherein the first junction extends between the first and second well regions in a first direction. A second shallow well region, which has the second conductivity type, is formed in the second high voltage well region. An anode well region having the second conductivity type is formed in the first high-voltage well region so as to meet the first shallow well region at a second junction. An anode contact region, which has the second conductivity type, is formed over and coupled to the anode well region. A cathode well region having the first conductivity type is formed in the second high-voltage well region so as to meet the second shallow well region at a third junction. A cathode contact region, which has the second conductivity type, is formed over and coupled to the cathode well region.

It will be appreciated that identifiers such as "first" and "second" do not imply any type of ordering, placement, or temporal relationship with respect to other elements; but rather "first" and "second" and other similar identifiers are just generic identifiers and these elements can be swapped in other implementations. Thus, while methods illustrated and described herein may be illustrated and/or described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein.

Further, it will be appreciated that "semiconductor substrate" or "wafer" as referred to herein may comprise any type of semiconductor material including a bulk silicon wafer, a binary compound substrate (e.g., GaAs wafer), a ternary compound substrate (e.g., AlGaAs), or higher order compound wafers, with or without additional insulating or conducting layers formed there over, among others. Further, the semiconductor substrate can also include non-semiconductor materials such as oxide in silicon-on-insulator (SOI), partial SOI substrate, polysilicon, insulator, oxide, metal, amorphous silicon, or organic material, among others. In some embodiments, the semiconductor substrate can also include multiple wafers or dies which are stacked or otherwise adhered together. The semiconductor substrate can include wafers which are cut from a silicon ingot, and/or any other type of semiconductor/non-semiconductor and/or deposited or grown (e.g. epitaxial) layers formed on an underlying substrate.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A silicon-controlled rectifier (SCR), comprising:
   an anode region comprising a plurality of linear or t-shaped p-type anode wells extending in parallel with one another in a first direction and spaced apart from one another in a second direction, wherein a p-type anode well has a length in the first direction and a width in the second direction; wherein the length of the p-type anode well is greater than the width of the p-type anode well;
   an n-type well region laterally surrounding the plurality of p-type anode wells;
   a p-type well region that directly meets the n-type well region at junction, wherein the pn junction extends between the p-type and n-type well regions in the second direction;
   a cathode region comprising a plurality of n-type cathode wells arranged within the p-type well region, wherein an n-type cathode well has a length in the first direction and a width in the second direction; wherein the length of the n-type cathode well is greater than the width of the n-type cathode well.

2. The SCR of claim 1, further comprising: an n-type buried layer arranged under the n-type well region.

3. The SCR of claim 1, further comprising: a deep p-well region arranged within a lower portion of the p-type well region.

4. The SCR of claim 1, wherein the plurality of p-type anode wells are spaced at regular intervals so neighboring p-type anode wells are separated by equal distances in the second direction.

5. The SCR of claim 4, wherein the width of the p-type anode well is less than the equal distance separating the neighboring p-type anode wells.

6. The SCR of claim 4, wherein the width of the p-type anode well is greater than the equal distance separating the neighboring p-type anode wells.

7. The SCR of claim 1, wherein the plurality of n-type cathode wells are linear or t-shaped n-type cathode wells extending in parallel with one another in the first direction and spaced apart from one another in the second direction.

8. The SCR of claim 7, further comprising:
   an anode extending in the second direction and arranged over the plurality of p-type anode wells and coupling the plurality of p-type anode wells to one another, wherein the anode has a higher doping concentration than the p-type anode wells;
   a cathode extending in the second direction and arranged over the plurality of n-type cathode wells and coupling the plurality of n-type cathode wells to one another, wherein the cathode has a higher doping concentration than the n-type cathode well; and a p-type gate extending in the second direction and arranged between the anode and cathode, and wherein the p-type gate is arranged over the plurality of n-type cathode wells.

9. The SCR of claim 7, wherein the plurality of n-type cathode wells mirror the plurality of p-type anode wells about the junction.

10. The SCR of claim 1, wherein the plurality of p-type anode wells have respective t-shapes with elongate top regions of the t-shapes being adjacent to the junction and narrow base regions of the t-shapes being distal relative to the junction.

11. A silicon-controlled rectifier (SCR) to provide current flow from an SCR anode to an SCR cathode through a semiconductor substrate, comprising:
   a p-type SCR anode;
   a plurality of linear or t-shaped p-type SCR anode wells extending in parallel with one another in a first direction and spaced apart from one another in a second direction and which are disposed under and coupled to the p-type SCR anode;
   an n-type shallow well laterally surrounding the plurality of linear or t-shaped p-type SCR anode wells;
   an n-type high voltage well in which the plurality of linear or t-shaped p-type SCR anode wells and the n-type shallow well are formed;
   a p-type high voltage well that directly meets the n-type high voltage well at a first pn junction;
   a plurality of linear or t-shaped n-type SCR cathode wells that are disposed in the p-type high voltage well;
   a p-type shallow well laterally surrounding the plurality of linear or t-shaped n-type SCR cathode wells; and
   an n-type SCR anode formed over and coupled to the plurality of linear or t-shaped n-type SCR cathode wells.

12. The SCR of claim 11, wherein the p-type SCR anode extends over the plurality of p-type SCR anode wells and is perpendicular thereto.

13. The SCR of claim 11:
   wherein a p-type SCR anode well has a length in a first direction and has a width in a second direction perpendicular to the first direction; wherein the length is greater than the width and wherein the junction extends in the second direction.

14. The SCR of claim 13, wherein the n-type shallow well laterally surrounds the plurality of p-type SCR anode wells so as to be disposed between neighboring p-type SCR anode wells.

15. The SCR of claim 13, where the p-type SCR anode extends continuously over the plurality of p-type SCR anode wells and has a length in the first direction and a width in the second direction, wherein the length of the p-type SCR anode is less than the width of the p-type SCR anode.

16. The SCR of claim 13, wherein nearest edges of the p-type SCR anode wells and n-type SCR cathode wells are on opposite sides of the first junction.

17. The SCR of claim 11, further comprising: an n-type buried layer arranged under the n-type high voltage well.

18. The SCR of claim 11, further comprising: a deep p-well arranged within a lower portion of the p-type high voltage well.

19. A semiconductor device disposed on a semiconductor substrate, comprising:
   a first high voltage well having a first conductivity type;
   a first shallow well having the first conductivity type and formed in the first high voltage well;
   a second high voltage well having a second conductivity type, which is opposite the first conductivity type, wherein the second high voltage well directly meets the first high voltage well at a first pn junction, wherein the first pn junction extends between the first and second high voltage wells in a first direction;
   a second shallow well having the second conductivity type and formed in the second high voltage well;
   a plurality of linear or t-shaped anode wells having the second conductivity type and formed in the first high voltage well so as to meet the first shallow well at a first plurality of junctions;
   an anode formed over and coupled to the anode well, the anode having the second conductivity type;
   a plurality of linear or t-shaped cathode wells having the first conductivity type and formed in the second high voltage well so as to meet the second shallow well at a second plurality of junctions; and
   a cathode formed over and coupled to the cathode well, the cathode having the second conductivity type.

20. The device of claim 19, wherein an anode well has a length in the first direction and a width in a second direction which is perpendicular to the first direction, wherein the length is greater than the width.

21. The device of claim 20, wherein the anode extends over the anode well and is perpendicular thereto.

22. The device of claim 20, wherein the plurality of linear or t-shaped anode wells are spaced at regular intervals so as to be separated by equal distances in the second direction.

\* \* \* \* \*